United States Patent
Wang et al.

(10) Patent No.: US 11,574,928 B2
(45) Date of Patent: Feb. 7, 2023

(54) SEMICONDUCTOR MEMORY STRUCTURE AND METHOD FOR FORMING THE SAME

(71) Applicant: TAIWAN SEMICONDUCTOR MANUFACTURING COMPANY, LTD., Hsinchu (TW)

(72) Inventors: Chenchen Jacob Wang, Hsinchu (TW); Sai-Hooi Yeong, Zhubei (TW); Bo-Feng Young, Taipei (TW); Chun-Chieh Lu, Taipei (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/243,732

(22) Filed: Apr. 29, 2021

(65) Prior Publication Data

US 2022/0352183 A1    Nov. 3, 2022

(51) Int. Cl.
| | |
|---|---|
| *H01L 27/1159* | (2017.01) |
| *H01L 27/11587* | (2017.01) |
| *H01L 29/417* | (2006.01) |
| *H01L 29/78* | (2006.01) |
| *H01L 21/28* | (2006.01) |
| *H01L 29/66* | (2006.01) |

(52) U.S. Cl.
CPC .... *H01L 27/1159* (2013.01); *H01L 27/11587* (2013.01); *H01L 29/40111* (2019.08); *H01L 29/41791* (2013.01); *H01L 29/6684* (2013.01); *H01L 29/66795* (2013.01); *H01L 29/7851* (2013.01); *H01L 29/78391* (2014.09)

(58) Field of Classification Search
CPC ............... H01L 29/785; H01L 27/1159; H01L 27/11587; H01L 29/40111; H01L 29/41791; H01L 29/66795; H01L 29/6684; H01L 29/78391; H01L 29/7851
See application file for complete search history.

(56) References Cited

U.S. PATENT DOCUMENTS

| | | | | |
|---|---|---|---|---|
| 6,340,600 | B1* | 1/2002 | Joo | H01L 21/02197 |
| | | | | 438/933 |
| 11,289,603 | B2* | 3/2022 | Young | H01L 29/7851 |
| 2019/0096767 | A1* | 3/2019 | Yeh | H01L 29/78391 |
| 2021/0183708 | A1* | 6/2021 | Yeh | H01L 29/66545 |
| 2021/0202747 | A1* | 7/2021 | Young | H01L 21/02192 |
| 2022/0173252 | A1* | 6/2022 | Young | H01L 21/02181 |

* cited by examiner

*Primary Examiner* — Earl N Taylor

(74) *Attorney, Agent, or Firm* — Birch, Stewart, Kolasch & Birch, LLP

(57) ABSTRACT

A semiconductor memory structure includes a fin structure formed over a substrate. The structure also includes a gate structure formed across the fin structure. The structure also includes spacers formed over opposite sides of the gate structure. The structure also includes source drain epitaxial structures formed on opposite sides of the gate structure beside the spacers. The gate structure includes a III-V ferroelectric layer formed between an interfacial layer and a gate electrode layer.

20 Claims, 16 Drawing Sheets

SEMICONDUCTOR MEMORY STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
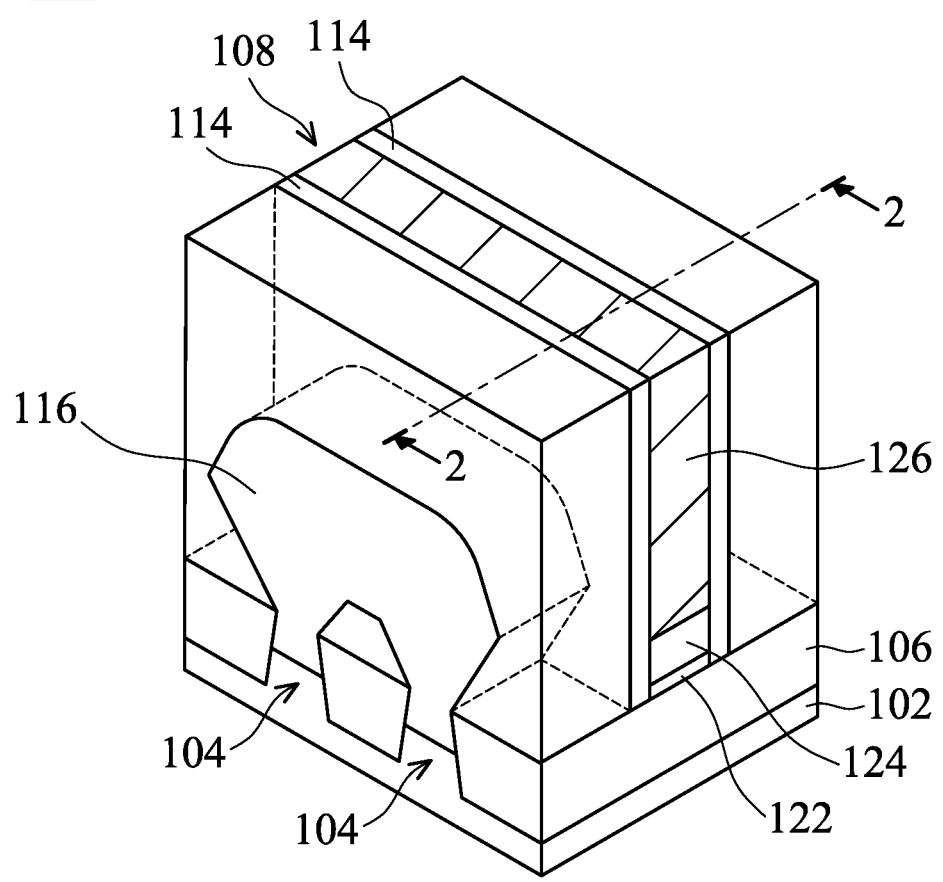
FIG. 1 is a perspective representation of a semiconductor memory structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor memory structure are provided. The method for forming the semiconductor memory structure may include forming a III-V ferroelectric layer between spacers to form a FeFET (ferroelectric field-effect transistor) or a FRAM (Ferroelectric Random Access Memory) structure. The III-V ferroelectric layer may reduce write-disturb issue and improve read-write performance.

Figure 2A:
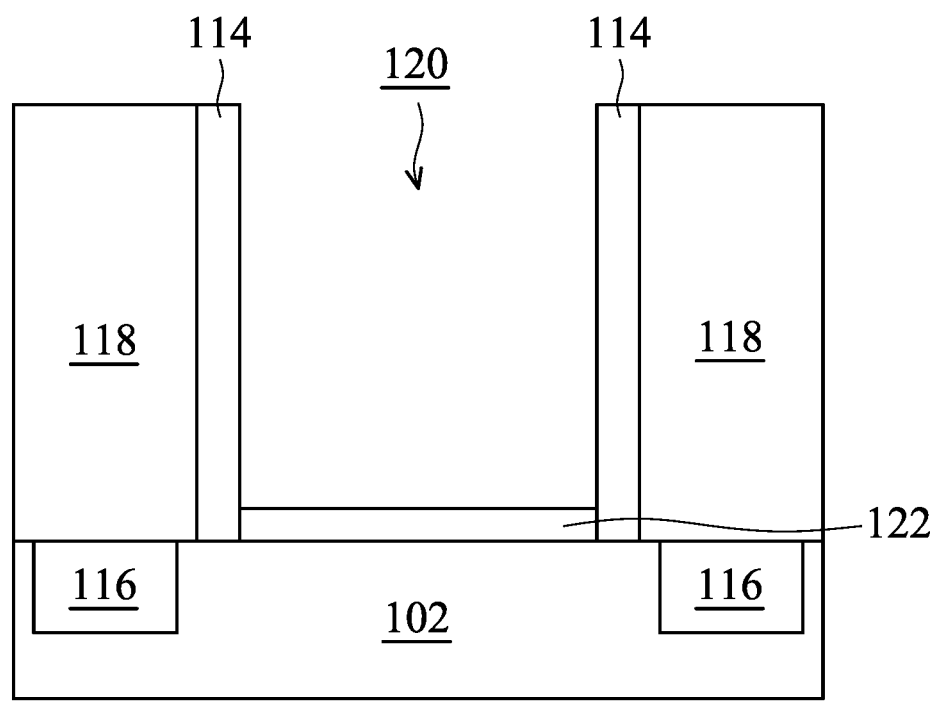
FIGS. 2A-2C are cross-sectional representations of various stages of forming a semiconductor memory structure, in accordance with some embodiments of the disclosure.
Figure 2B:
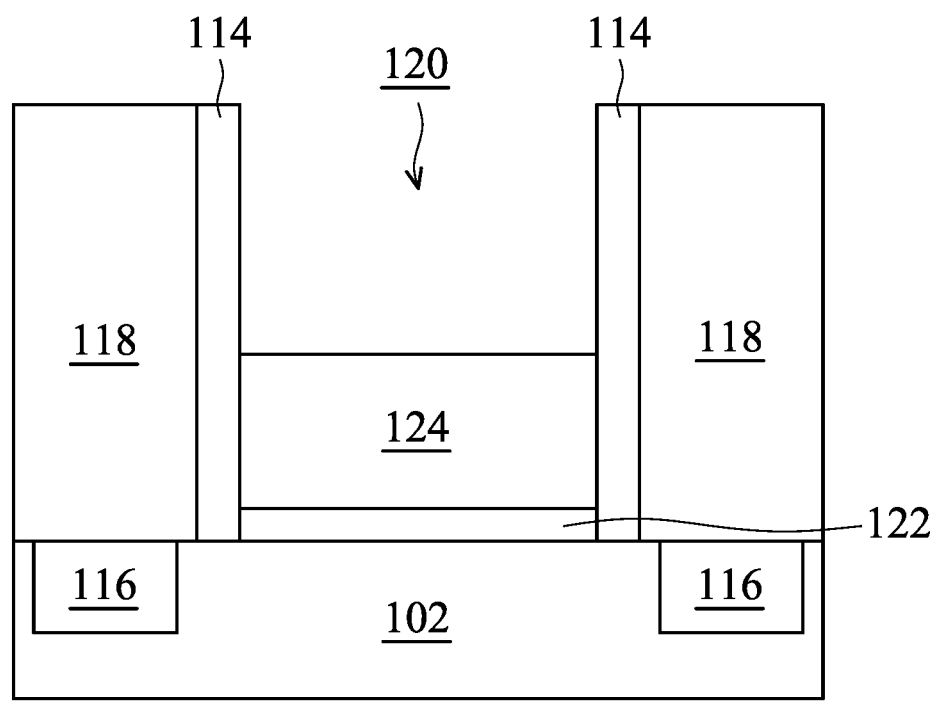
Figure 2C:
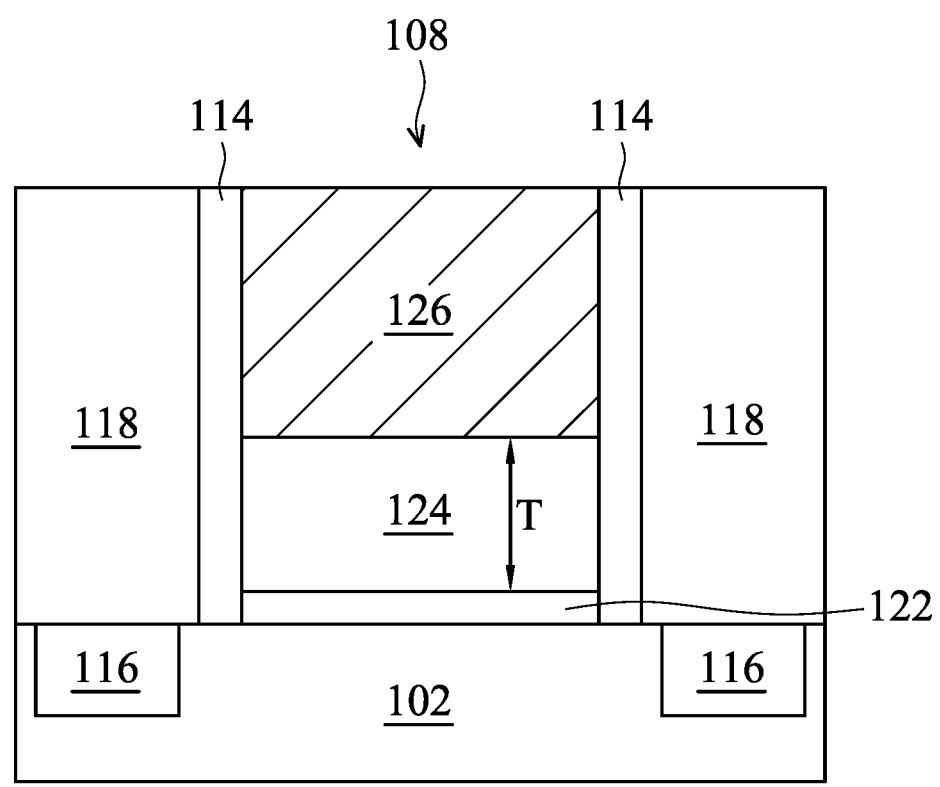

FIG. 1 is a perspective representation of a semiconductor memory structure 10a, in accordance with some embodiments of the disclosure. FIGS. 2A-2C are cross-sectional representations of various stages of forming the semiconductor memory structure 10a, in accordance with some embodiments of the disclosure. FIGS. 2A-2C show cross-sectional representations taken along line 2-2 in FIG. 1.

A substrate 102 is provided as shown in FIGS. 1 and 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to. SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a pad layer may be blanketly formed over the substrate 102, and a hard mask layer may be blanketly formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 102 to form a fin structure 104 by using the hard mask layer as a mask as shown in FIG. 1 in accordance with some embodiments. The etching process may be a dry etching process or a wet etching process. In some embodiments, the substrate 102 is etched, by a dry etching process. The dry etching process may include using a fluorine-based etchant gas, such as $SF_6$, $C_xF_y$, (Where x and y may be positive integers), $NF_3$, or a combination thereof. The etching process may be a time-controlled process, and continue until the fin structure 104 reaches a predetermined height. It should be noted that since the fin structure 104 and the substrate 102 are made of the same material, and there is no obvious interface between them.

Next, a liner layer may be conformally formed on the sidewalls and the top surface of the fin structure 104 (not shown). The liner layer may be used to protect the fin structure 104 from being damaged in the following processes (such as an anneal process or an etching process). In some embodiments, the liner layer is made of silicon nitride.

Next, an isolation layer 106 is formed to cover the fin structure 104 and the substrate 102 as shown in FIG. 1 in accordance with some embodiments. The isolation layer 106 may be made of silicon oxide, silicon nitride, silicon oxynitride, fluoride-doped silicate glass (FSG), or another low-k dielectric material. The isolation layer 106 may be deposited by a deposition process, such as a chemical vapor deposition (CVD) process, a spin-on-glass process, or another applicable process.

Afterwards, the isolation layer 106 may be planarized to expose the top surface of the patterned hard mask layer (not shown). The isolation layer 106 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 106, as shown in FIG. 1 in accordance with some embodiments. The etching process may be used to remove a portion of the liner layer and a portion of the isolation layer 106. As a result, the top portion of the fin structure 104 may be exposed and the remaining isolation layer 106 may surround the base portion of the fin structure 104. The remaining isolation layer 106 may be an isolation structure 106 such as a shallow trench isolation (STI) structure surrounding the base portion of the fin structure 104. The isolation structure 106 may be configured to prevent electrical interference or crosstalk.

Next, a dummy gate structure is formed over and across the fin structures 104 (not shown). The dummy gate structure may include a dummy gate dielectric layer and a dummy gate electrode layer. The dummy gate dielectric layer may be made of dielectric materials, such as silicon oxide, silicon nitride, silicon oxynitride, dielectric material(s) with high dielectric constant (high-k), or a combination thereof. The dummy gate dielectric layer may be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). The dummy gate structure may be made of polysilicon. The dummy gate structure may be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). The dummy gate dielectric layer and the dummy gate electrode layer may be replaced by the following steps to form a real gate structure with a dielectric layer and a metal gate electrode layer.

Afterwards, an etching process may be performed on the dummy gate structure to form the dummy gate structure by using a patterned photoresist layer as a mask (not shown). The etching process may be a dry etching process or a wet etching process. The dummy gate dielectric layer and the dummy gate electrode layer may be etched by a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 104 may be exposed on opposite sides of the dummy gate structure.

Next, a pair of spacers 114 is formed on opposite sidewalls of the dummy gate structure, as shown in FIGS. 1 and 2A in accordance with some embodiments. The spacers 114 may be made of silicon oxide, silicon nitride, silicon oxynitride, and/or dielectric materials. The spacers 114 may be formed by a chemical vapor deposition (CVD) process, a spin-on-glass process, or another applicable process.

Afterwards, the top portion of the fin structure 104 exposed on opposite sides of the dummy gate structure may be removed in an etching process to form a recess (not shown). The etching process may be a dry etching process or a wet etching process. The fin structures 104 may be etched by a dry etching process. The dry etching process may include using a fluorine-based etchant gas, such as $SF_6$, $C_xF_y$ (where x and y may be positive integers), $NF_3$, or a combination thereof.

Next, a source/drain epitaxial structure 116 is formed in the recess over the fin structure 104 on opposite sides of the dummy gate structure, as shown in FIGS. 1 and 2A in accordance with some embodiments. A strained material may be grown in the recess by an epitaxial (epi) process to form the source/drain epitaxial structure 116. In addition, the lattice constant of the strained material may be different from the lattice constant of the substrate 102. The source/drain epitaxial structure 116 may include Ge, SiGe, InAs, InGaAs, InSb, GaAs, GaSb, InAlP, InP, SiC, SiP, other applicable materials, or a combination thereof. The source/drain epitaxial structure 116 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HYPE), liquid phase epitaxy (LPE), chloride vapor phase epitaxy (Cl-VPE), or any other suitable method.

After the source/drain epitaxial structure 116 is formed, a first inter-layer dielectric (ILD) structure 118 is formed to cover the source/drain epitaxial structure 116, as shown in FIGS. 1 and 2A in accordance with some embodiments. The first ILD structure 118 may surround the fin structure 104 and the source/drain epitaxial structure 116.

The first ILD structure 118 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 118 may be formed by chemical vapor deposition (CVD), spin-on coating, or other applicable processes.

Afterwards, a planarizing process is performed on the first ILD structure 118 until the top surface of the dummy gate structure is exposed, as shown in FIGS. 1 and 2A in accordance with some embodiments. After the planarizing process, the top surface of the dummy gate structure may be substantially level with the top surfaces of the spacers 114 and the first ILD structure 118. The planarizing process may include a grinding process, a chemical mechanical polishing (CMF) process, an etching process, other applicable processes, or a combination thereof.

Next, the dummy gate structure including the dummy gate dielectric layer and the dummy gate electrode layer is removed to form a trench 120 between the spacers 114, as shown in FIG. 2A in accordance with some embodiments. The fin structure 104 may be exposed form the trench 120. The dummy gate dielectric layer and the dummy gate electrode layer may be removed by an etching process, such as a dry etching process or a wet etching process.

Next, an interfacial layer 122 is formed across the fin structure 104, as shown in FIGS. 1 and 2A in accordance with some embodiments. The interfacial layer 122 may be made of silicon oxide. The silicon oxide may be formed by an oxidation process (such as a dry oxidation process, or a wet oxidation process), deposition process (such as a chemical vapor deposition (CVD) process or an atomic layer deposition (ALD) process), other applicable processes, or a combination thereof. The interfacial layer 122 may be thermally grown using a thermal oxidation process in oxygen-containing ambient or nitrogen-containing ambient (e.g. NO or $N_2O$).

Afterwards, a III-V ferroelectric layer 124 is formed over the interfacial layer 122, as shown in FIGS. 1 and 2B in accordance with some embodiments. The III-V ferroelectric layer 124 may be a III-V ferroelectric material that can exhibit a hysteresis loop in accordance with an electric field caused by a dielectric polarization. The III-V ferroelectric material may be a material that exhibits electrically switchable polarization. In some embodiments, the III-V ferroelectric layer 124 includes AlScN, GaScN, AlYN, or a combination thereof. The ferroelectric layer 124 may be formed by a chemical vapor deposition process (CVD), a physical vapor deposition process (PVD), an atomic layer deposition process (ALD), other suitable processes, or a combination thereof. In some embodiments, the III-V ferroelectric layer 124 is formed by conformally depositing the III-V ferroelectric material in the trench 120, and an etch-back process is performed until the spacers 114 are exposed.

In some embodiments as shown in FIG. 1, the top surface of the III-V ferroelectric layer 124 is lower than the top surface of the source/drain epitaxial structure 116.

Next, a gate electrode layer 126 is formed over the III-V ferroelectric layer 124, and a gate structure 108 is formed as shown in FIGS. 1 and 2C in accordance with some embodiments. The gate electrode layer 126 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer 126 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof. Afterwards, a chemical mechanical polishing (CMP) process or an etching back process may be optionally performing to remove excess gate electrode layer materials.

In some embodiments as shown in FIG. 2C, the III-V ferroelectric layer 124 has a thickness T of in a range of about 1 nm to about 10 nm. If the thickness T is too thin, the leakage current may increase. If the thickness T is too thick, the write voltage of the semiconductor memory structure 10a may increase and it may difficult to write in the semiconductor memory structure 10a.

Figure 3:
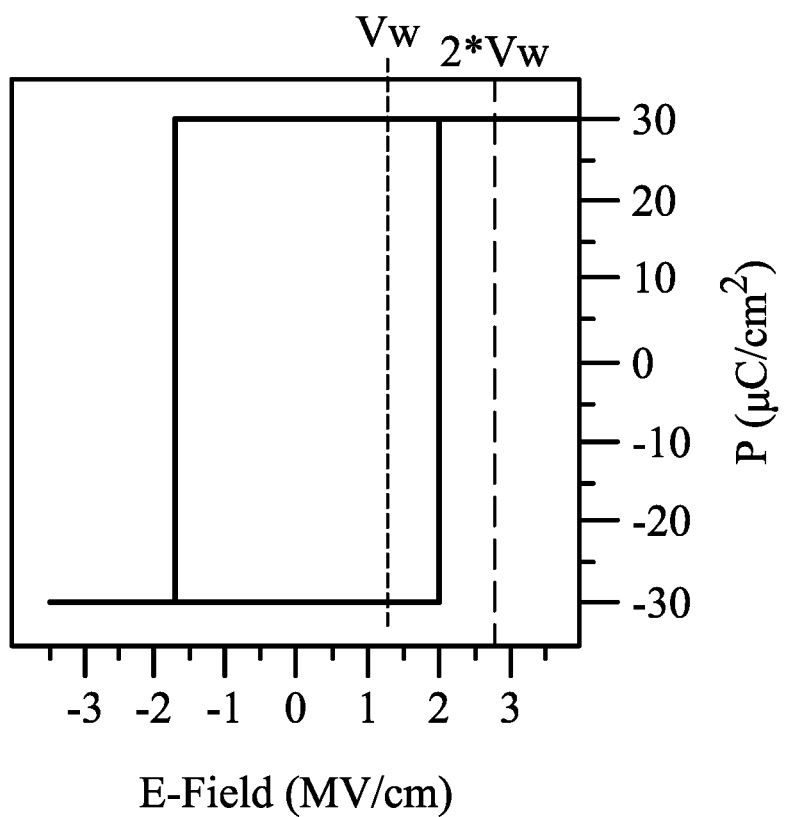
FIG. 3 is a polarization-electric field curve of the semiconductor memory structure shown in FIG. 2C in accordance with some embodiments of the disclosure.

In some embodiments as shown in FIG. 3, since the III-V ferroelectric layer 124 has ferroelectric domain orientation in certain directions, the polarization-electric field curve of the semiconductor memory structure 10a has a square hysteresis loop. Therefore, the write-disturb issue may be minimized, and the memory window and data retention may be improved.

In some embodiments as shown in FIGS. 2C and 3, the III-V ferroelectric layer 124 includes $Al_{1-x}Sc_xN$, $Ga_{1-x}Sc_xN$, $Al_{1-x}Y_xN$, or a combination thereof with the value of x in a range of about 0.1 to about 0.6. The shape of the polarization-electric field curve hysteresis loop may be modified by the value of x. If the value of x is too great, the ferroelectric domain orientation may be isotropic, and the semiconductor memory structure 10a may not have a square hysteresis loop. If the value of the x is too less, the III-V ferroelectric layer 124 may be breakdown.

With a III-V ferroelectric layer 124 formed in the gate structure 108, the polarization-electric field curve of the semiconductor memory structure 10a may have a square hysteresis loop. The write-disturb issue may be minimized, and the memory window and data retention may be improved. Moreover, the process of depositing the III-V ferroelectric layer 124 is compatible with CMOS process flow.

Figure 4:
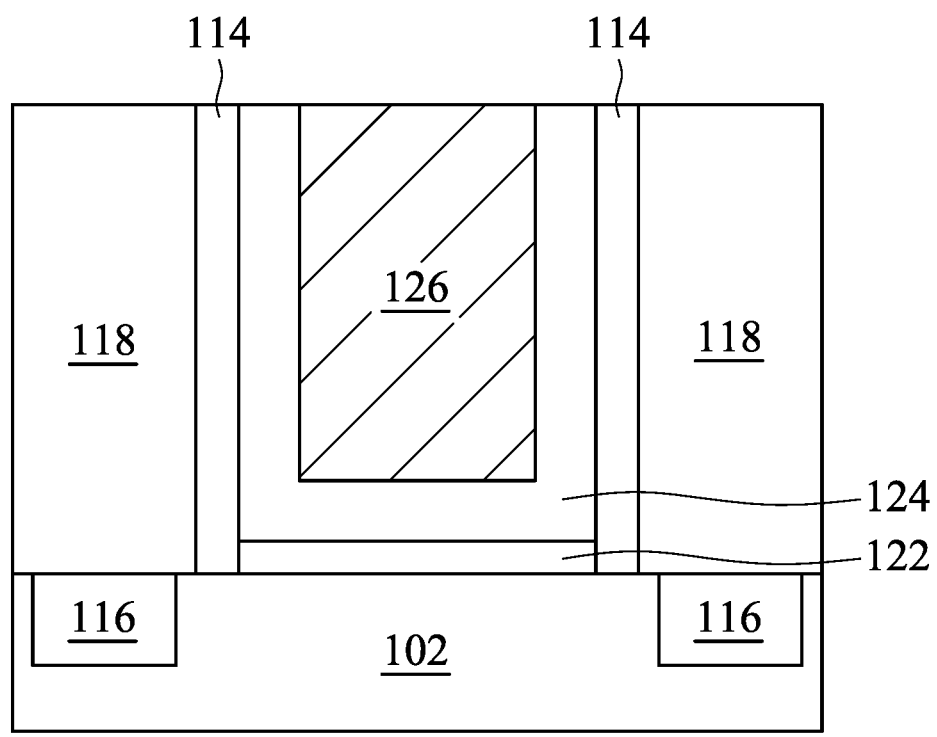
FIG. 4 is a cross-sectional representation of a modified semiconductor memory structure, in accordance with some embodiments of the disclosure.

Many variations and/or modifications may be made to the embodiments of the disclosure. FIG. 4 is a cross-sectional representation of a modified semiconductor memory structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4 in accordance with some embodiments, the ferroelectric layer 124 is conformally formed between the spacers 114 and the interfacial layer 122.

After forming the interfacial layer 122, the III-V ferroelectric layer 124 is conformally formed between the spacers 114 over the interfacial layer 122, as shown in FIG. 4 in accordance with some embodiments. As shown in FIG. 4, the III-V ferroelectric layer 124 may be deposited over the sidewall and the bottom surface of the trench 120. In some embodiments, the top surface of the ferroelectric layer 124 is level with the top surface of the gate electrode layer 126 and the top surface of the spacers 114. In some embodiments, the III-V ferroelectric layer 124 is in a U-shape in the cross-sectional view.

With a III-V ferroelectric layer 124 formed in the gate structure 108, the polarization-electric field curve of the semiconductor memory structure 10b may have a square hysteresis loop. The write-disturb issue may be minimized, and the memory window and data retention may be improved. Moreover, the process of depositing the III-V ferroelectric layer 124 is compatible with CMOS process flow. With the III-V ferroelectric layer 124 conformally formed between the spacers 114 over the interfacial layer 122, the III-V ferroelectric layer 124 is better controlled.

Figure 5A:
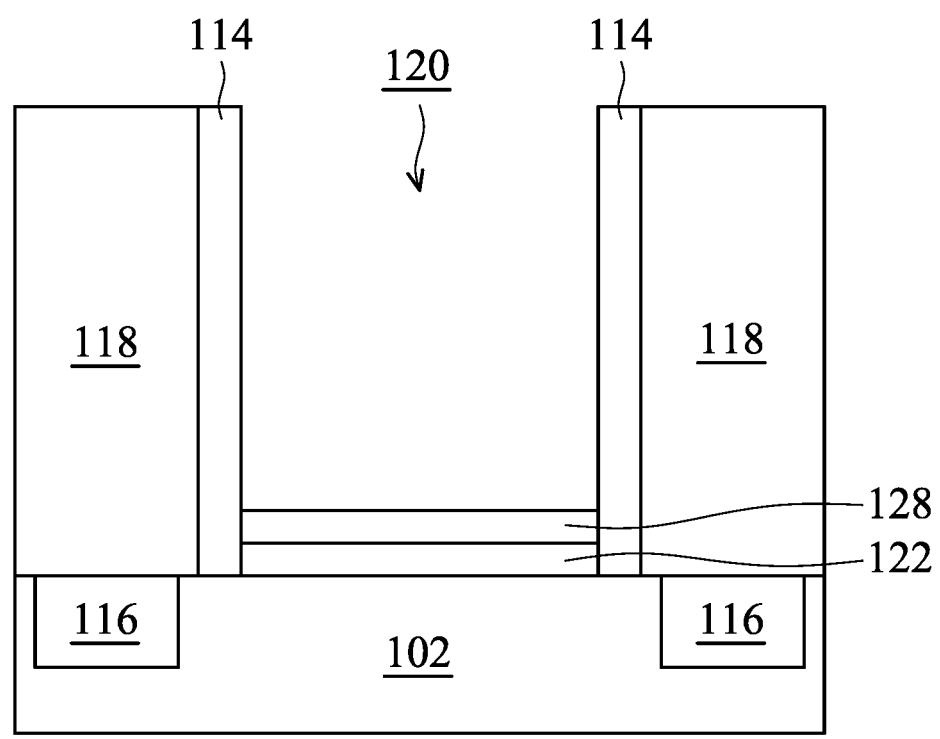
FIGS. 5A-5B are cross-sectional representations of various stages of forming a modified semiconductor memory structure, in accordance with some embodiments of the disclosure.
Figure 5B:
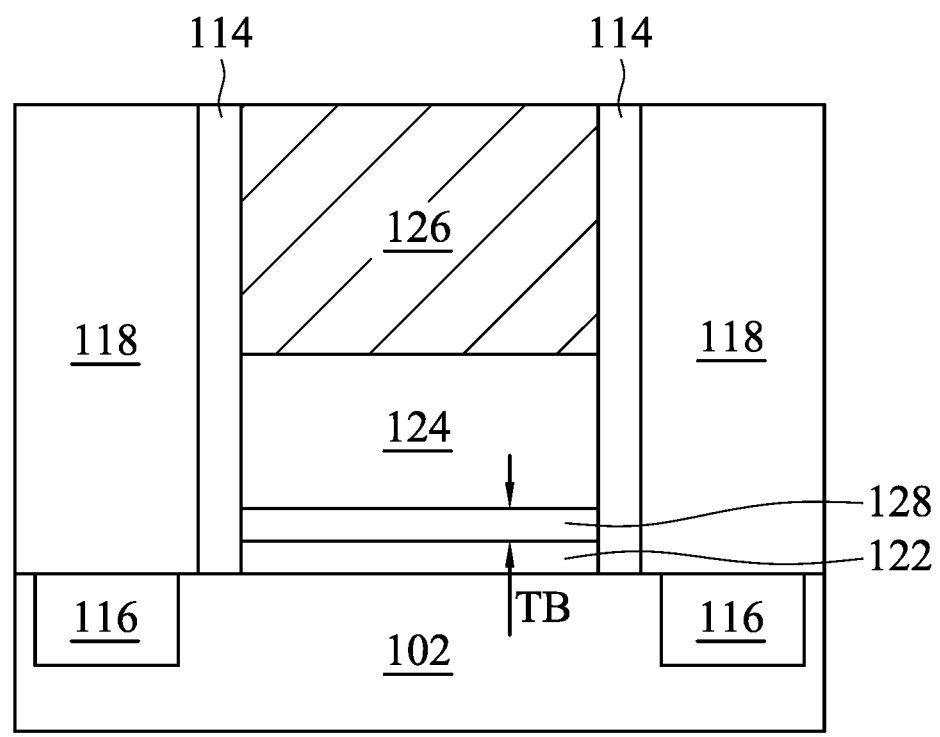

Many variations and/or modifications may be made to the embodiments of the disclosure. FIGS. 5A-5B are cross-sectional representations of a modified semiconductor memory structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5A in accordance with some embodiments, a buffer layer 128 is formed over the interfacial layer 122.

After forming the interfacial layer 122 the buffer layer 128 is formed over the interfacial layer 122 in the trench 120, as shown in FIG. 5A in accordance with some embodiments. The buffer layer 128 may provide better lattice matching and help to grow subsequently formed III-V ferroelectric layer 124. In some embodiments, the buffer layer 128 includes AlN, GaN, or a combination thereof. The buffer layer 128 may be formed by a chemical vapor deposition process (CVD), a physical vapor deposition process (MID), an atomic layer deposition process (ALD), other suitable processes, or a combination thereof.

The buffer layer 128 may be formed by conformally deposit the buffer layer material in the trench 120 over the interfacial layer 122, and an etch-back process is performed until the spacers 114 are exposed. In some embodiments as shown in FIG. 5A, the top surface of the buffer layer 128 is lower than the top surface of the spacers 114. In some embodiments, the buffer layer 128 is conformally formed over the sidewall and the bottom surface of the trench 120, so that the top surface of the buffer layer 128 is level with the top surface of the spacers 114.

In some embodiments as shown in FIG. 5B, the buffer layer 128 has a thickness TB of in a range of about 5 nm to about 20 nm. If the thickness TB is too thin, the subsequently formed III-V ferroelectric layer 124 may not be well grown. If the thickness TB is too thick, the write voltage of the semiconductor memory structure 10c may increase and it may difficult to write in the semiconductor memory structure 10c.

Afterwards, as shown in FIG. 5B, a III-V ferroelectric layer 124 is formed over the buffer layer 128 and the gate electrode layer 126 is formed over the III-V ferroelectric layer 124. The processes for forming the III-V ferroelectric layer 124 and the gate electrode layer 126 may be the same as, or similar to, those used to form the III-V ferroelectric layer 124 and the gate electrode layer 126 in the embodiments as shown in FIGS. 2B and 2C. For the purpose of brevity, the descriptions of these processes are not repeated herein.

With a III-V ferroelectric layer 124 formed in the gate structure 108, the polarization-electric field curve of the semiconductor memory structure 10c may have a square hysteresis loop. The write-disturb issue may be minimized, and the memory window and data retention may be improved. Moreover, the process of depositing the III-V ferroelectric layer 124 is compatible with CMOS process flow. With a buffer layer 128 formed between the interfacial layer 122 and the III-V ferroelectric layer 124, the buffer layer 128 may provide better lattice matching and the III-V ferroelectric layer 124 may be grown better.

Figure 6A:
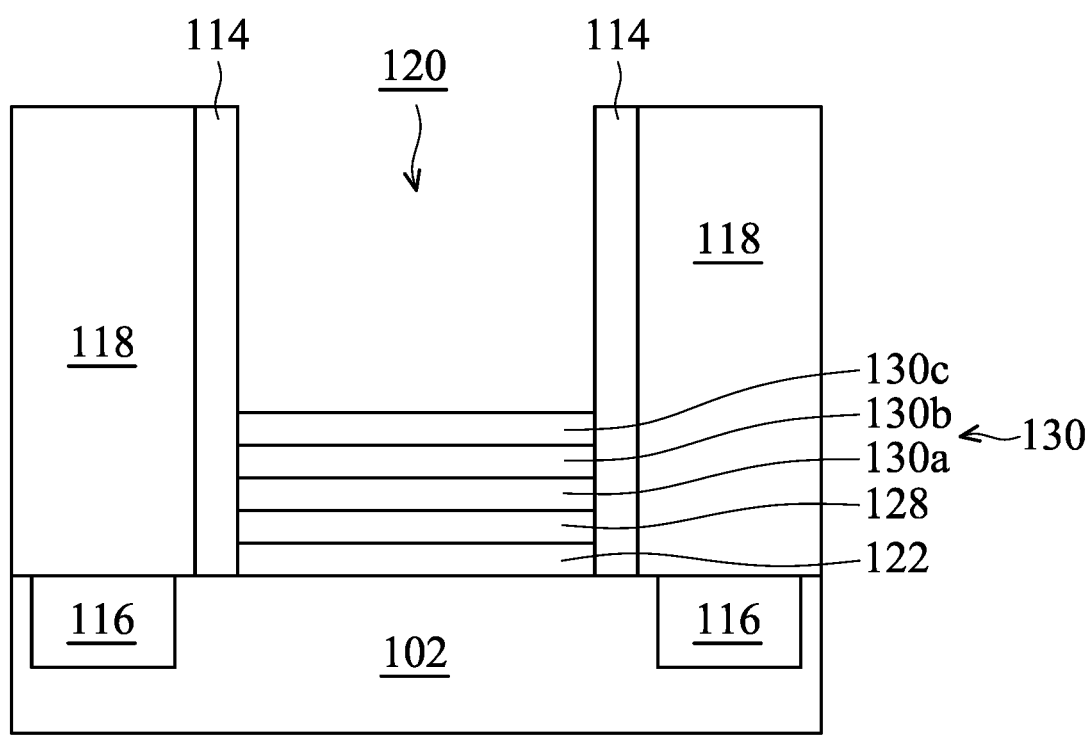
FIGS. 6A-6B are cross-sectional representations of various stages of forming a modified semiconductor memory structure, in accordance with some embodiments of the disclosure.
Figure 6B:
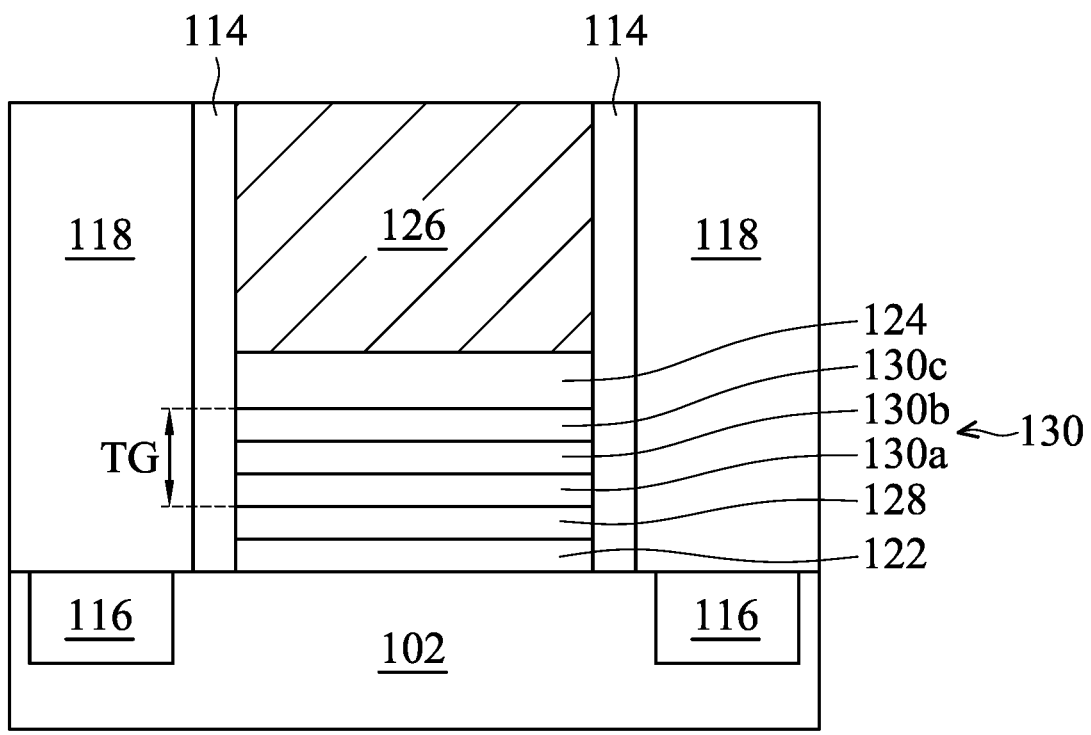

Many variations and/or modifications may be made to the embodiments of the disclosure. FIGS. 6A-6B are cross-sectional representations of a modified semiconductor memory structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6A in accordance with some embodiments, a gradient III-V ferroelectric structure 130 is formed over the buffer layer 128 between the spacers 114.

As shown in FIG. 6A, the gradient III-V ferroelectric structure 130 includes more than one III-V ferroelectric layers. For example, the gradient III-V ferroelectric structure 130 includes III-V ferroelectric layers 130a. 130b and 130c. In some embodiments, the III-V ferroelectric layers 130a, 130b, and 130c includes $Al_{1-x}Sc_xN$, $Ga_{1-x}Sc_xN$, $Al_{1-x}Y_xN$, or a combination thereof with the value of x in a range of about 0.1 to about 0.6. The value of x is different in different III-V ferroelectric layers of the gradient III-V ferroelectric structure 130. In some embodiments, the value of x of upper ferroelectric layers 130c of the gradient ferroelectric structure 130 is greater than the value of x of lower III-V ferroelectric layers 130a of the gradient III-V ferroelectric structure 130.

In some embodiments, the concentration of Sc or Y in an upper portion of the gradient ferroelectric structure 130 such as the III-V ferroelectric layers 130c near the subsequently formed III-V ferroelectric layer is greater than the concentration of Sc or Y in a bottom portion of the gradient III-V ferroelectric structure 130 such as the III-V ferroelectric layers 130a near the buffer layer 128.

Next, as shown in FIG. 6B, a III-V ferroelectric layer 124 is formed over the gradient III-V ferroelectric structure 130 and the gate electrode layer 126 is formed over the III-V ferroelectric layer 124. The processes for forming the III-V ferroelectric layer 124 and the gate electrode layer 126 may be the same as, or similar to, those used to form the III-V ferroelectric layer 124 and the gate electrode layer 126 in the embodiments as shown in FIGS. 2B and 2C. For the purpose of brevity, the descriptions of these processes are not repeated herein.

Since the concentration of Se or Y gradient increases from the buffer layer 128 to the III-V ferroelectric layer 124, the lattice matching may be improved and it may be easier to grow subsequently formed III-V ferroelectric layer 124.

In some embodiments as shown in FIG. 6B, the gradient III-V ferroelectric structure 130 has a thickness TG in a range of about 5 nm to about 500 nm. If the thickness TG is too thin, the subsequently formed III-V ferroelectric layer 124 may not be well grown. If the thickness TG is too thick, the write voltage of the semiconductor memory structure 10c may increase and it may difficult to write in the semiconductor memory structure 10c.

It should be noted that, although in the embodiments of FIG. 6B, three layers of III-V ferroelectric layers are shown in the gradient III-V ferroelectric structure 130, the number of layers of III-V ferroelectric layers are not limited thereto depending on the needs of lattice matching. In addition, as long as the concentration of Sc or Y increases from bottom to top of the gradient III-V ferroelectric structure 130, there may not be definite borders between the ferroelectric layers of the gradient III-V ferroelectric structure 130.

With a III-V ferroelectric layer 124 formed in the gate structure 108, the polarization-electric field curve of the semiconductor memory structure 10d may have a square hysteresis loop. The write-disturb issue may be minimized, and the memory window and data retention may be improved. Moreover, the process of depositing the III-V ferroelectric layer 124 is compatible with CMOS process flow. With a gradient III-V ferroelectric structure 130 formed between the buffer layer 128 and the III-V ferroelectric layer 124, the gradient III-V ferroelectric structure 130 with gradient Sc or Y concentration may provide better lattice matching and the III-V ferroelectric layer 124 may be grown better.

Figure 7A:
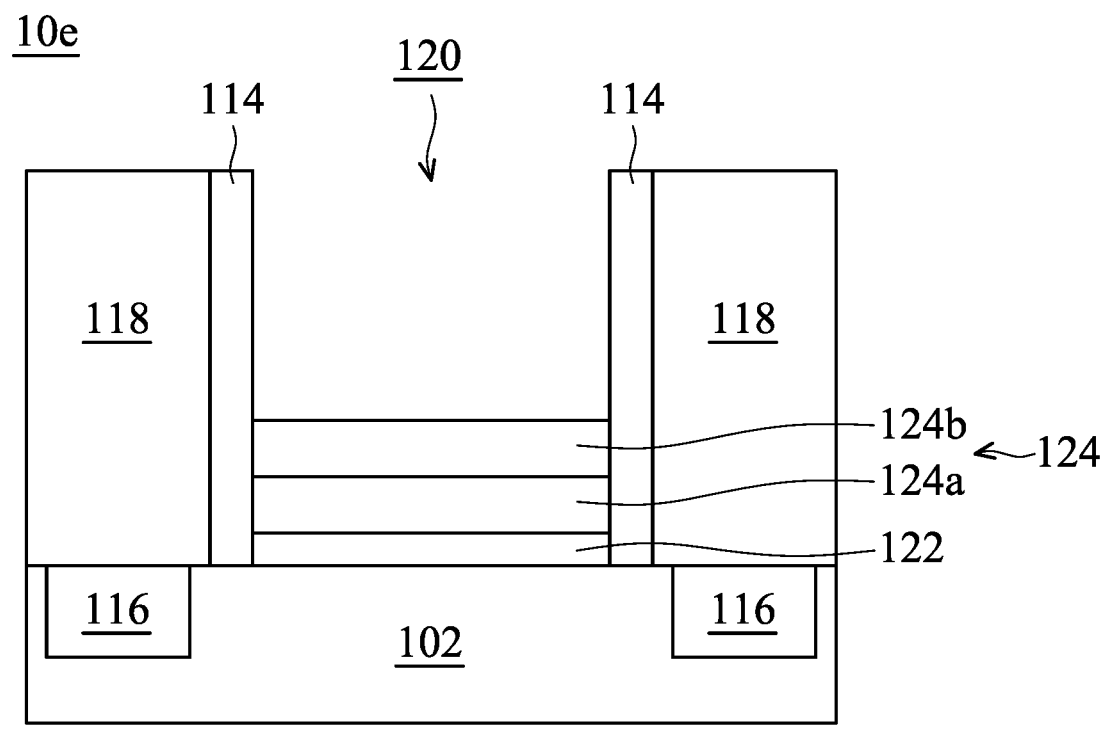
FIGS. 7A-7B are cross-sectional representations of various stages of forming a modified semiconductor memory structure, in accordance with some embodiments of the disclosure.
Figure 7B:
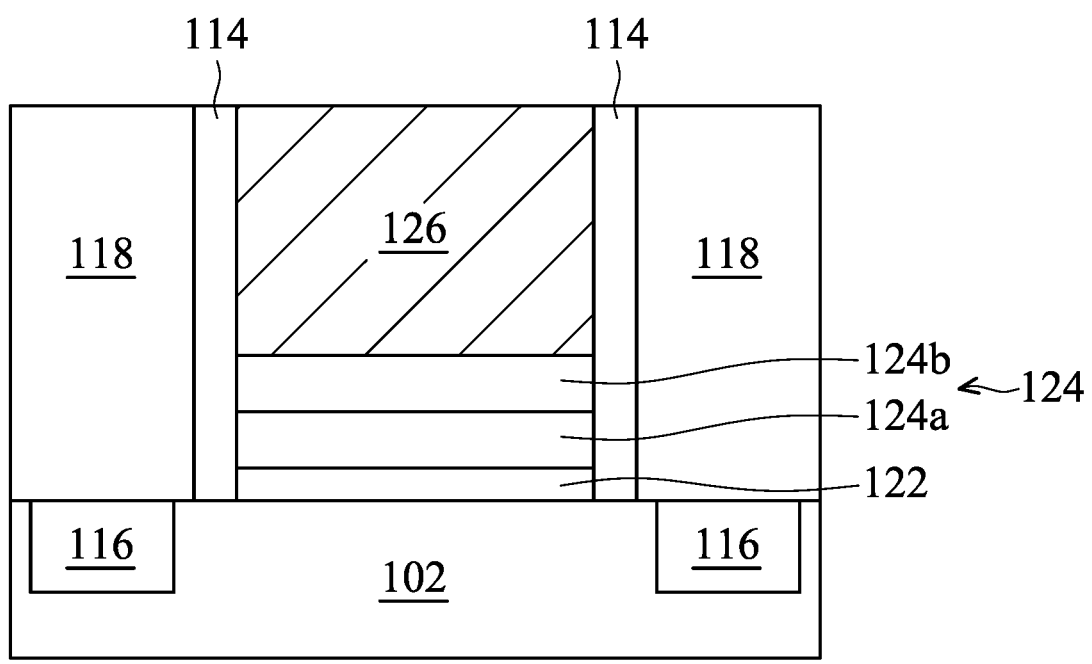

Many variations and/or modifications may be made to the embodiments of the disclosure. FIGS. 7A-7B are a cross-sectional representations of a modified semiconductor memory structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 7A in accordance with some embodiments, the III-V ferroelectric layer 124 includes a first III-V ferroelectric layer 124a and a second III-V ferroelectric layer 124b, which are made of different materials.

In some embodiments, the first III-V ferroelectric layer 124a and the second III-V ferroelectric layer 124b include, AlScN, GaScN, AlYN, or a combination thereof. In some embodiments, the first III-V ferroelectric layer 124a and the second III-V ferroelectric layer 124b include $Al_{1-x}Sc_xN$, $Al_{1-x}Y_xN$, or a combination thereof with the value of x in a range of about 0.1 to about 0.6. The first III-V ferroelectric layer 124a and the second III-V ferroelectric layer 124b may be formed by a chemical vapor deposition process (CVD), a physical vapor deposition process (PVD), an atomic layer deposition process (ALD), other suitable processes, or a combination thereof.

In some embodiments, the first III-V ferroelectric layer 124a and the second III-V ferroelectric layer 124b may be sequentially formed. In some embodiments, the first III-V ferroelectric material is conformally formed in the trench 120, and an etch-back process is performed until the spacers 114 are exposed. Afterwards, the second III-V ferroelectric material is conformally formed over the first III-V ferroelectric layer 124a in the trench 120, and an etch-back process is performed until the spacers 114 are exposed. In some embodiments, the first III-V ferroelectric material and the second III-V ferroelectric material are sequentially conformally formed in the trench 120, and an etch-back process is performed on the first III-V ferroelectric layer 124a and the second III-V ferroelectric layer 124b until the spacers 114 are exposed.

Next, as shown in FIG. 7B, the gate electrode layer 126 is formed over the III-V ferroelectric layer 124 including the first III-V ferroelectric layer 124a and the second III-V ferroelectric layer 124b. The processes for forming the gate electrode layer 126 may be the same as, or similar to, those used to form the III-V ferroelectric layer 124 and the gate electrode layer 126 in the embodiments as shown in FIGS. 2B and 2C. For the purpose of brevity, the descriptions of these processes are not repeated herein.

With different materials of first III-V ferroelectric layer 124a and the second III-V ferroelectric layer 124b, the shape of the polarization-electric field curve hysteresis loop may be modified, which may provide more flexibility of application needs.

It should be noted that, although in the embodiments of FIG. 7B, two different III-V ferroelectric layers 124 (124a and 124b) are shown, the number of layers of III-V ferroelectric layers 124 are not limited thereto, depending on the needs of different application.

With a III-V ferroelectric layer 124 formed in the gate structure 108, the polarization-electric field curve of the semiconductor memory structure 10c may have a square hysteresis loop. The write-disturb issue may be minimized, and the memory window and data retention may be improved. Moreover, the process of depositing the III V ferroelectric layer 124 is compatible with CMOS process flow. With a III-V ferroelectric layer 124 made of several III-V ferroelectric layer layers 124 made of different III-V ferroelectric materials, the shape of the polarization-electric field curve hysteresis loop may be modified by application needs.

Figure 8A:
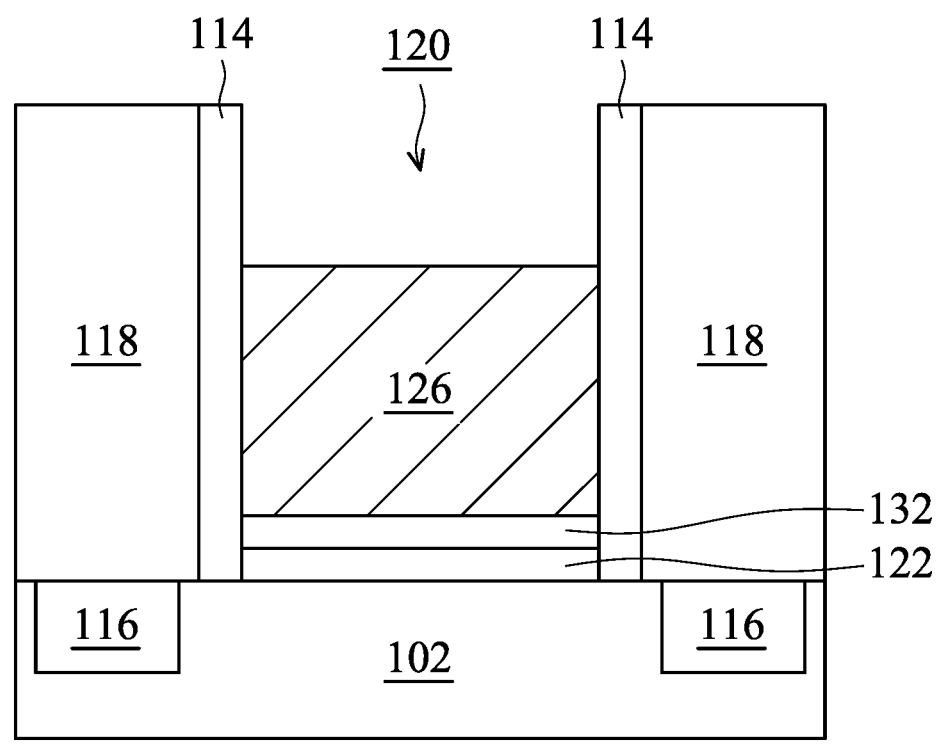
FIGS. 8A-8B are cross-sectional representations of various stages of forming a modified semiconductor memory structure, in accordance with some embodiments of the disclosure.
Figure 8B:
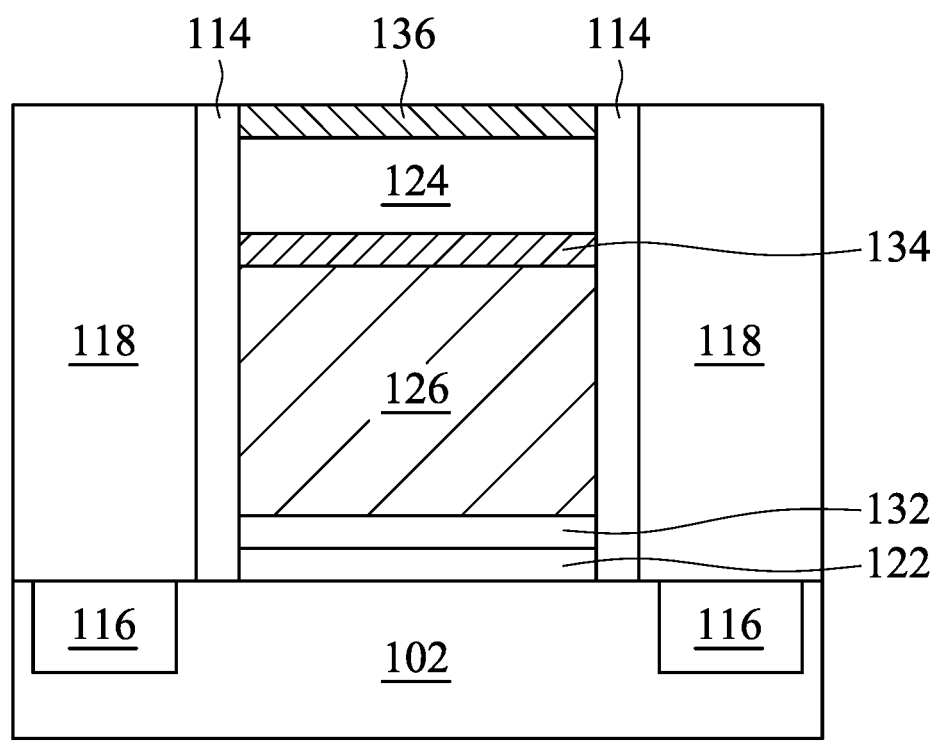

Many variations and/or modifications may be made to the embodiments of the disclosure. FIGS. 8A-8B are cross-sectional representations of a modified semiconductor memory structure 10f, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 8A in accordance with some embodiments, the gate electrode layer 126 is etched back and the spacers 114 are exposed from the trench 120.

In some embodiments as shown in FIG. 8A, a high-k dielectric layer 132 is formed over the interfacial layer 122 in the trench 120. The high-k dielectric layer 132 may have a dielectric constant is greater than 3.9. The high-k dielectric layer 132 may include hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfLaO, HfSiO, HfSiON, HfTiO, LaSiO, AlSiO, (Ba, Sr) $TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

Next, as shown in FIG. 8A, the gate electrode layer 126 is formed over the high-k dielectric layer 132. The processes for forming the gate electrode layer 126 may be the same as, or similar to, those used to form the gate electrode layer 126 in the embodiments as shown in FIG. 2C. For the purpose of brevity, the descriptions of these processes are not repeated herein. As shown in FIG. 8A, the gate electrode layer 126 is then etched back and the spacers 114 are exposed from the trench 120. The gate electrode layer 126 may be etched by a dry etching process (e.g., an anisotropic plasma etching method), a wet etching process, or a combination thereof.

Afterwards, as shown in FIG. 8B in accordance with some embodiments, a bottom electrode 134, a III-V ferroelectric layer 124, and a top electrode 136 are sequentially formed in the trench 120 over the gate electrode layer 126. The structure including the bottom electrode 134, the III-V ferroelectric layer 124, and the top electrode 136 may be referred to as a polarization switching structure. The polarization switching structure may be sequentially formed by conformally depositing the bottom electrode material in the trench 120, and then the bottom electrode material is etched back to expose the spacers 114 from the trench 120. The III-V ferroelectric material is later conformally deposited in the trench 120, and then is etched back to expose the spacers 114 from the trench 120. Later, the top electrode material is deposited in the trench, and then a planarization process such as a chemical mechanical polishing (CMP) process or an etch back process is optionally performed to remove excess conductive materials.

The bottom electrode layer 134 and the top electrode 136 of the polarization switching structure over the gate electrode layer 126 may include TiN, TaN, WN, Ru, Ti, Ta, W, Mo, Re, Nb, other applicable materials, an alloy thereof, or a combination thereof. The bottom electrode layer 134 and the top electrode 136 may be formed by a chemical vapor deposition process (CVD), a physical vapor deposition process (PVD), (e.g., evaporation or sputter), an atomic layer deposition process (ALD), an electroplating process, another suitable process, or a combination thereof.

The III-V ferroelectric layer 124 of the polarization switching structure over the gate electrode layer 126 may include AlScN, GaSeN, AlYN, or a combination thereof. In some embodiments, the III-V ferroelectric layer 124 of the polarization switching structure include $Al_{1-x}Sc_xN$, $Ga_{1-x}Sc_xN$, $Al_{1-x}Y_xN$, or a combination thereof with the value of x in a range of about 0.1 to about 0.6. The III-V ferroelectric layer 124 of the polarization switching structure may be formed by a chemical vapor deposition process (CVD), a physical vapor deposition process (PVD), an atomic layer deposition process (ALD), other suitable processes, or a combination thereof.

With a III-V ferroelectric layer 124 formed in the polarization switching structure over the gate electrode layer 126, the polarization-electric field curve of the semiconductor memory structure 10f may have a square hysteresis loop. The write-disturb issue may be minimized, and the memory window and data retention may be improved. Moreover, the process of depositing the ferroelectric layer 124 is compatible with CMOS process flow and a FRAM structure with a ferroelectric polarization switching structure is easily formed.

Figure 9:
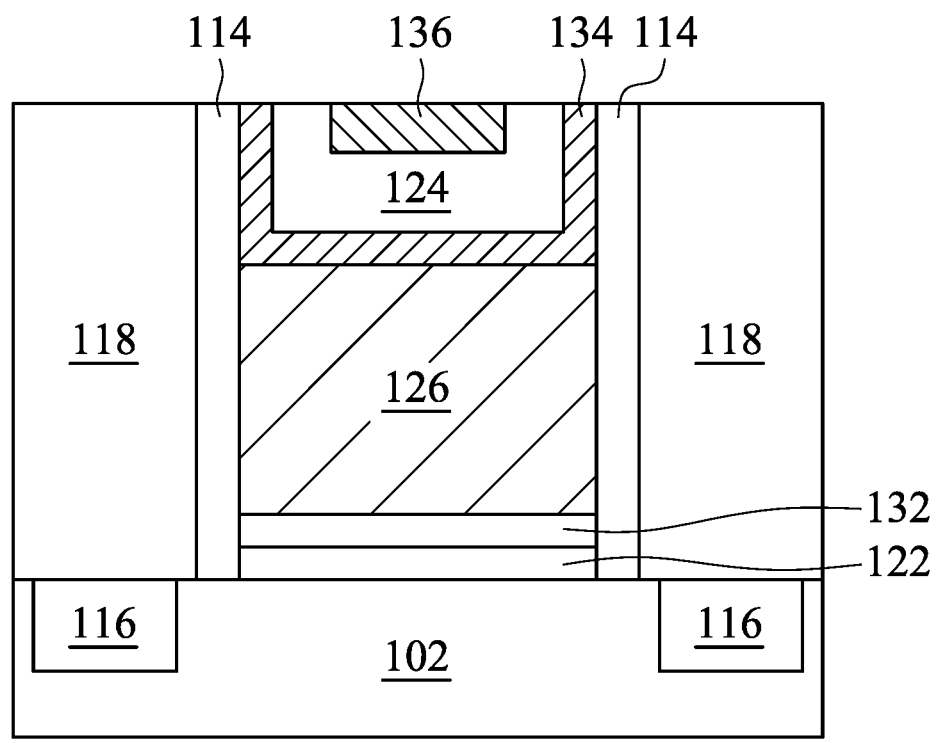
FIG. 9 is a cross-sectional representation of a modified semiconductor memory structure, in accordance with some embodiments of the disclosure.

Many variations and/or modifications may be made to the embodiments of the disclosure. FIG. 9 is a cross-sectional representation of a modified semiconductor memory structure 10g, in accordance with some embodiments of the disclosure. Some processes or devices are the same as, or similar to, those described in the embodiments above, and therefore the descriptions of these processes and, devices are not repeated herein. The difference from the embodiments described above is that, as shown in FIG. 9 in accordance with some embodiments, the bottom electrode layer 134 is wrapping around the III-V ferroelectric layer 124, and the III-V ferroelectric layer 124 is wrapping around the top electrode 136.

In some embodiments as shown in FIG. 9, after the bottom electrode layer 134 is conformally deposited in the trench 120, the III-V ferroelectric layer 124 is also conformally deposited in the trench 120, and the top electrode layer 136 is filled in the trench 120. Therefore, the production time and cost may be reduced. In some embodiments, the bottom electrode layer 134 and the III-V ferroelectric layer 124 are in a U-shape from a cross-section view.

With a III-V ferroelectric layer 124 formed in the polarization switching structure over the gate electrode layer 126, the polarization-electric field curve of the semiconductor memory structure 10g may have a square hysteresis loop. The write-disturb issue may be minimized, and the memory window and data retention may be improved. Moreover, the process of depositing the III-V ferroelectric layer 124 is compatible with CMOS process flow and a FRAM structure with a III-V ferroelectric polarization switching structure is easily formed. In addition, with the bottom electrode layer 134 and the III-V ferroelectric layer 124 conformally formed over the gate electrode layer 126, the production time and cost may be reduced.

Figure 10:
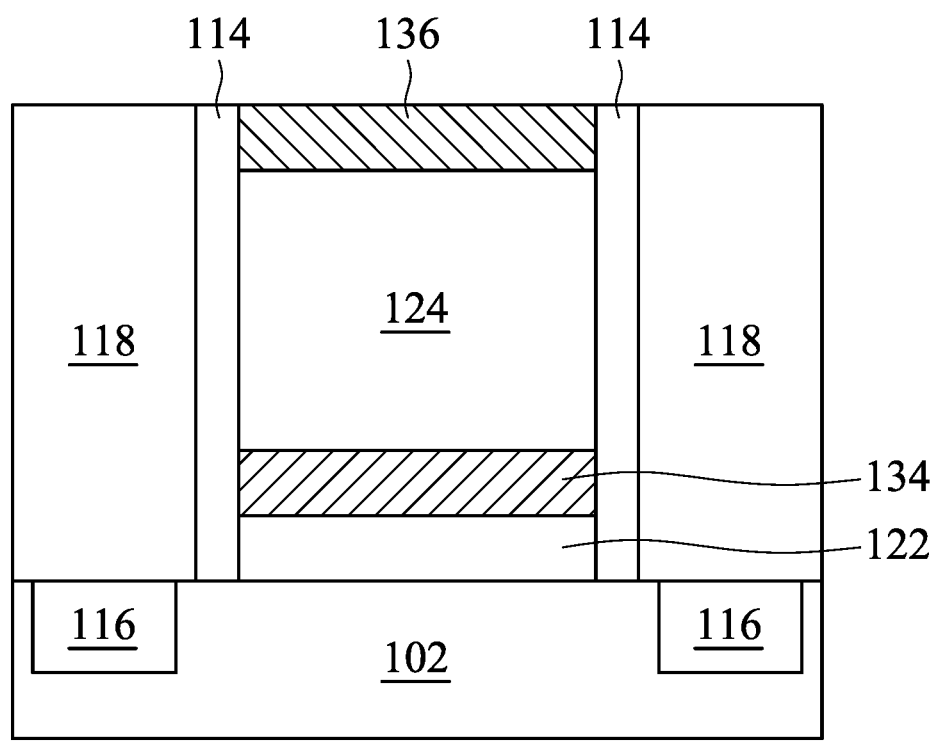
FIG. 10 is a cross-sectional representation of a modified semiconductor memory structure, in accordance with some embodiments of the disclosure.

Many variations and/or modifications may be made to the embodiments of the disclosure. FIG. 10 is a cross-sectional representation of a modified semiconductor memory structure 10h, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 10 in accordance with some embodiments, the polarization switching structure is directly formed over the interfacial layer 122.

As shown in FIG. 10, after forming the interfacial layer 122, the bottom electrode 134, the III-V ferroelectric layer 124, and the top electrode 136 are sequentially formed in the trench 120 over the interfacial layer 122. In some embodiments, the interfacial layer 122 is in direct contact with the bottom electrode 134. Therefore, the production time and cost may be reduced. The processes for forming the interfacial layer 122, the bottom electrode 134, the III-V ferroelectric layer 124, and the top electrode 136 may be the same as, or similar to, those used to form the interfacial layer 122, the bottom electrode 134, the III-V ferroelectric layer 124, and the top electrode 136 in the embodiments as shown in FIG. 8B. For the purpose of brevity, the descriptions of these processes are not repeated herein.

With a III-V ferroelectric layer 124 formed in the polarization switching structure over the interfacial layer 122, the polarization-electric field curve of the semiconductor memory structure 10f may have a square hysteresis loop. The write-disturb issue may be minimized, and the memory window and data retention may be improved. Moreover, the process of depositing the ferroelectric layer 124 is compatible with CMOS process flow and a FRAM structure with a III-V ferroelectric polarization switching structure is easily formed. In addition, by directly forming the polarization switching structure over the interfacial layer 122, the production time and cost may be reduced.

As described previously, a ferroelectric, layer 124 may be formed between the spacers 114 in the gate structure 108 or over the gate structure 108. The polarization-electric field curve of the semiconductor memory structure may have a square hysteresis loop which may minimize the write-disturb issue. Moreover, the memory window and data retention may be improved. In some embodiments as shown in FIG. 4, the III-V ferroelectric layer 124 is in a U-shape in the cross-sectional view. In some embodiments as shown in FIG. 5B, a buffer layer 128 is formed between the interfacial layer 122 and the III-V ferroelectric layer 124 which may help to grow the III-V ferroelectric layer 124. In some embodiments as shown in FIG. 6B, a gradient III-V ferroelectric structure 130 is formed between the buffer layer 128 and the III-V ferroelectric layer 124, which may help to grow the III-V ferroelectric layer 124. In some embodiments as shown in FIG. 7B, the III-V ferroelectric layer 124 of different III-V ferroelectric materials provides flexibility to modify the polarization-electric field curve. In some embodiments as shown in FIG. 8B, a polarization switching structure with the III-V ferroelectric layer 124 is formed over the gate structure 108, which is compatible with the current process. In some embodiments as shown in FIG. 9B, the bottom electrode 134 and the III-V ferroelectric layer 124 of the polarization switching structure is in a U-shape in the cross-sectional view. In some embodiments as shown in FIG. 10, the polarization switching structure with the III-V ferroelectric layer 124 is directly formed over the interfacial layer 122.

Embodiments of a semiconductor memory structure and a method for forming the same are provided. With a III-V ferroelectric layer formed in the semiconductor memory structure, the write-disturb issue may be minimized. Moreover, the memory window and data retention may be improved. The III-V ferroelectric layer is also compatible with the current process.

In some embodiments, a semiconductor memory structure is provided. The semiconductor memory structure includes a fin structure formed over a substrate. The semiconductor memory structure also includes a gate structure formed across the fin structure. The semiconductor memory structure also includes spacers formed over opposite sides of the gate structure. The semiconductor memory structure also includes source/drain epitaxial structures formed on opposite sides of the gate structure beside the spacers. The gate structure comprises a III-V ferroelectric layer formed between an interfacial layer and a gate electrode layer.

In some embodiments, a semiconductor memory structure is provided. The semiconductor memory structure includes a fin structure formed over a substrate. The semiconductor memory structure also includes a gate structure formed over the fin structure. The semiconductor memory structure also includes spacers formed over opposite sides of the gate structure. The semiconductor memory structure also includes source/drain epitaxial structures formed on opposite sides of the gate structure. The semiconductor memory structure also includes a III-V ferroelectric layer is formed over an interfacial layer in the gate structure between the spacers. The III-V ferroelectric layer includes AlScN, GaScN, AlYN, or a combination thereof.

In some embodiments, a method for forming a semiconductor memory structure includes forming a fin structure over a substrate. The method for forming a semiconductor memory structure also includes forming a gate structure across the fin structure. The method for forming a semiconductor memory structure also includes forming spacers beside the gate structure. The method for forming a semiconductor memory structure also includes growing source/drain regions on opposite sides of the gate structure. The method for forming a semiconductor memory structure also includes forming a III-V ferroelectric layer between the spacers. The III-V ferroelectric layer comprises AlScN, GaSeN, AlYN, or a combination thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor memory structure, comprising:
a fin structure formed over a substrate;
a gate structure formed across the fin structure;
spacers formed over opposite sides of the gate structure; and source/drain epitaxial structures formed on opposite sides of the gate structure beside the spacers,
wherein the gate structure comprises a III-V ferroelectric layer formed between an interfacial layer and a gate electrode layer.

2. The semiconductor memory structure as claimed in claim 1, wherein the III-V ferroelectric layer comprises AlScN, GaScN, AlYN, or a combination thereof.

3. The semiconductor memory structure as claimed in claim 1, further comprising:
a buffer layer formed between the interfacial layer and the III-V ferroelectric layer.

4. The semiconductor memory structure as claimed in claim 3, wherein the buffer layer comprises AlN, GaN, or a combination thereof.

5. The semiconductor memory structure as claimed in claim 3, further comprising:
a gradient III-V ferroelectric structure formed between the buffer layer and the III-V ferroelectric layer.

6. The semiconductor memory structure as claimed in claim 5, wherein a concentration of Sc or Y in an upper portion of the gradient III-V ferroelectric structure near the III-V ferroelectric layer is greater than a concentration of Sc or Y in a bottom portion of the gradient III-V ferroelectric structure near the buffer layer.

7. The semiconductor memory structure as claimed in claim 1, wherein a thickness of the III-V ferroelectric layer is in a range of about 1 nm to about 10 nm.

8. A semiconductor memory structure, comprising:
a fin structure formed over a substrate;
a gate structure formed over the fin structure;
spacers formed over opposite sides of the gate structure;
source/drain epitaxial structures formed on opposite sides of the gate structure; and
a III-V ferroelectric layer formed over an interfacial layer in the gate structure between the spacers,
wherein the III-V ferroelectric layer comprises AlScN, GaScN, AlYN, or a combination thereof.

9. The semiconductor memory structure as claimed in claim 8, further comprising:
a bottom electrode formed over the gate structure; and
a top electrode formed over the bottom electrode,
wherein the III-V ferroelectric layer is between the bottom electrode and the top electrode.

10. The semiconductor memory structure as claimed in claim 8, wherein the III-V ferroelectric layer comprises $Al_{1-x}Sc_xN$, $Ga_{1-x}Sc_xN$, $Al_{1-x}Y_xN$, or a combination thereof, wherein a value of x is in a range of about 0.1 to about 0.6.

11. The semiconductor memory structure as claimed in claim 8, further comprising:
a buffer layer formed over the interfacial layer; and
a gradient III-V ferroelectric structure formed over the buffer layer,
wherein the gradient III-V ferroelectric structure comprises a plurality of III-V ferroelectric layers.

12. The semiconductor memory structure as claimed in claim 11, wherein the plurality of III-V ferroelectric layers comprises $Al_{1-x}Sc_xN$, $Ga_{1-x}Sc_xN$, $Al_{1-x}Y_xN$, or a combination thereof, wherein a value of x is different in different III-V ferroelectric layers of the gradient III-V ferroelectric structure.

13. The semiconductor memory structure as claimed in claim 12, wherein the value of x of upper III-V ferroelectric layers of the gradient III-V ferroelectric structure is greater than the value of x of lower III-V ferroelectric layers of the gradient III-V ferroelectric structure.

14. The semiconductor memory structure as claimed in claim 11, wherein a thickness of the buffer layer is in a range of about 5 nm to about 20 nm.

15. A method for forming a semiconductor memory structure, comprising:
forming a fin structure over a substrate;
forming a gate structure across the fin structure;
forming spacers beside the gate structure;
growing source/drain regions on opposite sides of the gate structure; and
forming a III-V ferroelectric layer between the spacers,
wherein the III-V ferroelectric layer comprises AlScN, GaScN, AlYN, or a combination thereof.

16. The method for forming a semiconductor memory structure as claimed in claim 15, wherein the III-V ferroelectric layer is conformally formed between the spacers over an interfacial layer.

17. The method for forming a semiconductor memory structure as claimed in claim 15, further comprising:
forming a bottom electrode below the III-V ferroelectric layer; and
forming a top electrode over the III-V ferroelectric layer.

18. The method for forming a semiconductor memory structure as claimed in claim 17, wherein the III-V ferroelectric layer is wrapping around the top electrode.

19. The method for forming a semiconductor memory structure as claimed in claim 17, further comprising:
forming an interfacial layer below the bottom electrode,
wherein the interfacial layer is in direct contact with the bottom electrode.

20. The method for forming a semiconductor memory structure as claimed in claim 15, wherein forming the III-V ferroelectric layer comprises:
forming a first III-V ferroelectric layer; and
forming a second III-V ferroelectric layer,
wherein the first III-V ferroelectric layer and the second III-V ferroelectric layer are made of different materials.

* * * * *